United States Patent [19]

Webb

[11] Patent Number: 5,426,311

[45] Date of Patent: Jun. 20, 1995

[54] SOLID-STATE VARIABLE-CONDUCTANCE DEVICE

[75] Inventor: Richard A. Webb, Yorktown Heights, N.Y.

[73] Assignee: International Business Machines Corporation, Armonk, N.Y.

[21] Appl. No.: 452,186

[22] Filed: Dec. 18, 1989

[51] Int. Cl.[6] .......................................... H01L 29/76
[52] U.S. Cl. ........................................ 257/9; 257/14
[58] Field of Search ................ 357/5, 6, 4, 16; 257/9, 257/14

[56] References Cited

U.S. PATENT DOCUMENTS

| | | | |
|---|---|---|---|
| 3,953,749 | 4/1976 | Baechtold et al. | 357/5 |
| 4,835,578 | 5/1989 | Ohtoshi et al. | 357/16 |
| 4,969,018 | 11/1990 | Reed | 357/16 |
| 4,999,682 | 3/1991 | Xu et al. | 357/16 |

OTHER PUBLICATIONS

Fulton et al., "Observation of Single-Electron Charging Effects in Small Tunnel Junctions," Phys. Rev. Let., vol. 59, pp. 109–112, Jul. 6, 1987.

Meirav et al., "One-dimensional electron gas in GaAs: Periodic conductance oscillation as a function of density," Phys. Rev. B, vol. 40, pp. 5871–5874, Sep. 15, 1989.

Scott-Thomas et al., "Conductance Oscillations Periodic in Density of a One Dimensional Electron Gas," Phys. Rev. Let., vol. 62, pp. 583–586, Jan. 30, 1989.

Primary Examiner—William D. Larkins
Attorney, Agent, or Firm—J. David Ellett, Jr.; Robert M. Trepp

[57] ABSTRACT

A gate-controlled quantum wire device is disclosed, which may use a channel of electrically resistive material involving tunneling between localized states.

7 Claims, 4 Drawing Sheets

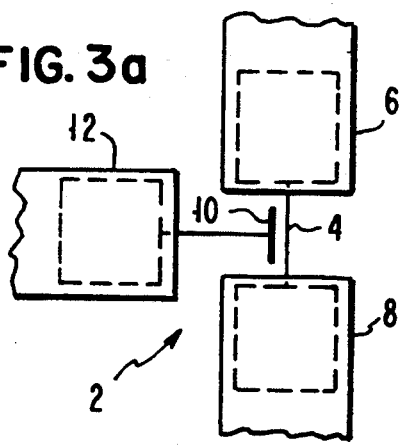
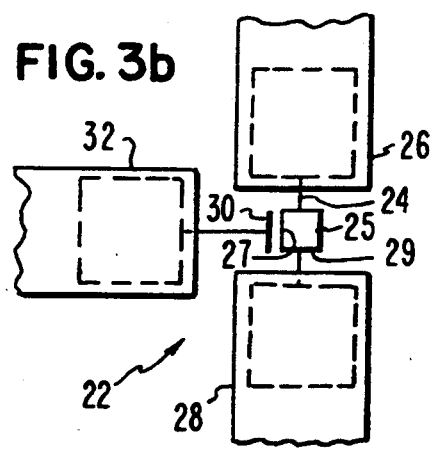
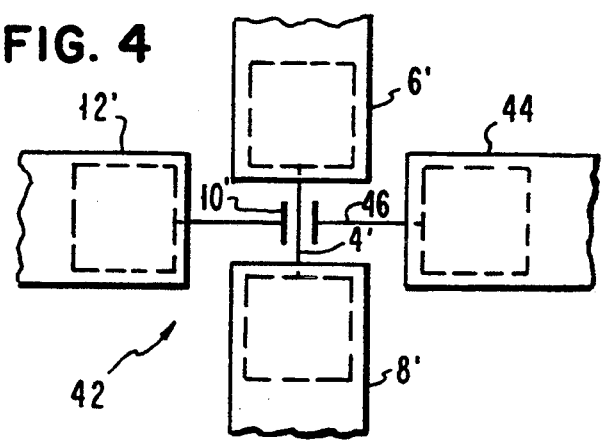
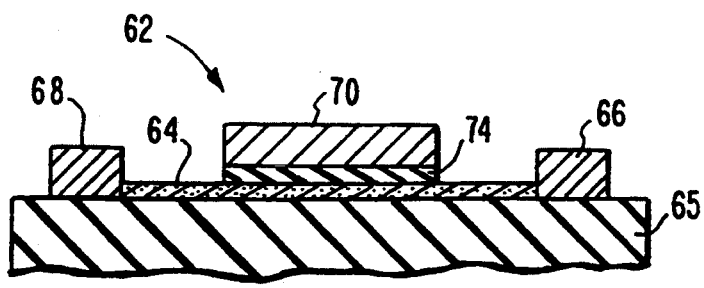

SOLID-STATE VARIABLE-CONDUCTANCE DEVICE

FIELD OF THE INVENTION

The present invention concerns a solid-state electronic device and more particularly concerns a device in which the electrical conductance between two of terminals of the device can be controllably varied by application of a control signal to a third terminal of the device.

BACKGROUND ART

A publication by K. K. Likharev in *IBM J. of Research and Development* Vol. 32, pp. 144-157, (January 1988) discloses electronic devices which incorporate conventional tunnel junctions. Conventional tunnel junctions are ordinarily roughly 1 to 5 nm thick in the direction of electron tunnelling. Such thicknesses are comparable to the dimensions of electronic wave functions in the material of the junctions. According to pages 149 and 156 of the publication, the capacitance of leads attached to such tunnel junctions can give rise to problems with respect to observing certain electronic tunnelling effects. It is proposed in the Likharev publication that placing a large resistance close to the tunnel junction might reduce the problem of lead capacitance. However, it is not explained how to accomplish placement of such a resistor in practice. Indeed, it is questioned on page 156 whether or not a suitable resistor can be realized even in principle.

A publication by Fulton and Dolan in Physical Review Letters, volume 59, pages 109-112 (6 Jul. 1987) discloses a complex device having three conventional tunnel junctions connected in parallel to a central electrode mounted on a substrate which is capacitatively coupled to a gold-chromium film of the opposing side of the substrate. A voltage across one of the junctions biased with a fixed current was reported oscillate as a function of a voltage applied to the gold-chromium film.

A publication by Scott-Thomas et al in *Physical Review Letters*, Volume 62, pages 583-586 (30 Jan. 1989) discloses certain silicon devices having a narrow channel defined in it which is reported to confine electrons in the channel to essentially one dimension. A publication by Meirev et al. in Physical Review B, volume 40, pages 5871-5874 discloses a similar device in GaAs. Irregular oscillations in the conductance of the devices are reported to occur as a function of a density of electrons in the channels. According to the publications, it is necessary for the width and thickness of the channels to be comparable to the electron wave length. Low disorder and high electrical mobility are asserted to be necessary in the articles.

SUMMARY OF THE INVENTION

The present invention concerns a variable-conductance electronic device having a current-injection terminal for injecting an electric current into the device, a current-withdrawal terminal for withdrawing current from the device, and a conductance-control terminal for applying a conductance-control signal to the device to control the electrical conductance between the current-injection terminal and the current-withdrawal terminal of the device. The current-injection terminal and the current-withdrawal terminal are connected by a signal path which includes an elongated current-passage strip of an electrically-resistive material. The current-passage strip has a longitudinal current-path dimension extending generally along the direction of the current flow through the strip and crosswise dimensions extending generally perpendicular to the direction of current flow through the strip. The longitudinal current-path dimension is substantially greater than a crosswise dimension of the strip. A characteristic dimension of the quantum-mechanical wave function of a single electron in the electrically-resistive material of the current-passage strip in bulk at room temperature defines a device electron wavelength. The longitudinal current-path dimension of the current-passage strip is orders of magnitude greater than the device electron wavelength. The crosswise dimensions of the strip are a plurality of times greater than the device electron wavelength. The conductance-control terminal of the variable-conductance device of the invention is connected to a conductance-control electrode located proximate to the current-passage strip of electrically-resistive material and is adapted to impress a conductance-control electric field on at least a portion of the strip in response to a conductance-control signal applied to the conductance-control terminal. In operation, when the variable-conductance device of the invention is maintained at a sufficiently low temperature, a substantially-linearly varying conductance-control signal applied to the conductance-control terminal of the device causes the electrical conductance between the current-injection terminal and the current-withdrawal terminal to vary in an at least approximately oscillatory fashion.

Preferably, the current-passage strip of electrically resistive material connecting the current-injection terminal and the current-withdrawal terminal has a resistance of greater than about 25 k$\Omega$, and more preferably has a resistance greater than about 100 k$\Omega$.

Preferably, the electrically-resistive material of the current-passage strip is a semimetal such as indium oxide ($In_2O_3$). Other electrically-resistive materials including semiconductors such as gallium arsenide and silicon are expected to be suitable for the current-passage strip in certain applications.

The conductance-control electrode is preferably located spaced apart from, but closely proximate to the strip of resistive material in order impress an electric field over at least a portion of the strip. The electric field is believed to alter the charge or charge distribution within the current-passage strip, which in turn alters the details of electron transport such as electron tunnelling within the strip which can alter the overall conductance of the strip.

When a preferred variable-conductance device of the invention is biased at a voltage such that an essentially dc current passes between the current-injection terminal and the current-withdrawal terminal and the temperature of the device is sufficiently low, the magnitude of the current oscillates substantially periodically between two values as the conductance-control voltage is increased. The period of the oscillation appears to correspond at least approximately to the voltage necessary to add or subtract one additional electron to at least a portion of the current-passage strip connecting the current-injection and current-withdrawal terminals.

The mechanism by which the variable-conductance device of the invention functions is not fully understood at this time. The following proposed mechanism is currently believed to be correct for preferred embodiments of the invention and is offered for the benefit of the reader, but is not to be considered as limiting the invention in any way. The strip of electrically-resistive material is believed to include a number of localized electronic states at positions along the length of the strip. Electrons are believed to travel from one of these localized electronic states to a successive one by a tunnelling mechanism. An effective tunnelling capacitance $C_{ij}$ may be associated with each pair of localized electronic states denoted i,j between which electrons may tunnel. The magnitude of the effective tunnelling capacitance $C_{ij}$ depends upon the microscopic properties of the localized electronic states, their effective separation and the dielectric constant of the intervening material. The inverse of the separation distance between the positions of successive localized electronic states in part determines the effective tunnelling capacitance $C_{ij}$ for each pair of states. When an electron tunnels over a short distance, the effective tunnelling capacitance is expected to be relatively large; when it tunnels over a long distance, the effective tunnelling capacitance is expected to be small.

The overall capacitance between the current-injection terminal and the current-withdrawal terminal is determined by the shape and spacing of the terminals, the dielectric properties of the substrate and the overall effective capacitance of the strip of electrically-resistive material extending between the two terminals. In the elongated current-passage strip of resistive material, it is believed that an electron must, in general, tunnel many times to pass through the entire strip and that such tunnelling barriers are encountered more or less in series. It is expected that one of the tunnelling barriers has a lowest effective tunnelling capacitance. The shorter tunnelling barriers and resistive portions of the material are believed to tend to isolate the tunnelling barrier having the lowest effective capacitance from parasitic capacitance associated with the current-injection terminal and the current-withdrawal terminal since, in general, shorter tunnelling sites and resistive portions of the strip will be located effectively in series between the tunnelling barrier with the lowest effective tunnelling capacitance in the strip and the two terminals.

It is expected that the degree of isolation from parasitic capacitance associated with the current-injection and current-withdrawal terminals can be influenced by adjusting the total resistance R of the current-passage strip extending between the current-injection terminal and the current-withdrawal terminal. Preferably for voltages between the two terminals greater than e/2C, where C is the effective tunnelling capacitance of the strip, the total resistance R is greater than about 25 kΩ. Both the magnitude of the total resistance R and the properties of the localized electronic states can be adjusted by varying the crosswise dimensions of the current-passage strip of resistive material, the amount of lattice disorder in the strip, and the material used to fabricate the strip.

If the magnitude of an externally applied voltage V applied between the current-injection terminal and the current-withdrawal terminal is below a voltage threshold value, but is greater than zero and if the temperature of the device is below a temperature threshold value, the current through preferred embodiments of the device of the invention is found to be essentially zero. It is believed that the essentially zero current results when the externally applied voltage defines an electron energy eV which is small compared to the charging energy $$E_C = \frac{e^2}{2c}$$

for an effective tunnelling capacitance C of the strip—symbolically, for $$eV < \frac{e^2}{2C} = E_C,$$

where e is the quantum of electric charge—and when the temperature T of the device satisfies $k_B T < E_C$, where $k_B$ is the Boltzmann constant. When the magnitude of the externally applied voltage exceeds the threshold value and the temperature is below the temperature threshold value, a current will pass through the device. It is believed that the shape of the voltage-current curve for the device depends upon both the quantity and distribution of charge in the device, which in turn is believed to be influenced by the electric field to which regions containing the tunnelling barriers with the lowest effective tunnelling capacitance in the current-passage strip are exposed. It is expected that the amount and distribution of charge in the device can be continuously altered by changing the voltage on the conductance-control terminal. Whatever the mechanism, the shape of the voltage-current curve of preferred embodiments of the device of the invention is influenced by the magnitude of the conductance-control signal applied to the conductance-control terminal of the device.

The ultimate speed of the variable-conductance device of the invention is expected to be related to a single-electron-tunnelling frequency $$\nu = \frac{I_{dc}}{e},$$

which is analogous to the Josephson frequency $$\nu = \frac{2eV_{dc}}{h}$$

in magnetics. A preferred embodiment of the variable-conductance device of the invention has been operated with an $I_{dc}$ in excess of about 4 nA, which corresponds to a single-electron-tunnelling frequency of about $2.5 \times 10^{10}$ Hz. In principle, it is expected that a preferred device of the invention could operate at speeds of $10^{13}$ Hz (0.1 picoseconds).

The smaller the effective tunnelling capacitance of the current-passage strip, the higher the temperature of operation the variable-conductance device is expected to be.

Preferably, the device can be fabricated using electron-beam lithography to form a current-passage strip of electrically-resisitive material which is thin and narrow. The current passage strip can be straight or curved and can include one or more loops. For current-passage strips of indium oxide, widths in the range of from about 30 nm to about 100 nm and thicknesses in the range of from about 18 to about 33 nm have been found to be suitable. A device having an indium oxide strip about 140 nm wide, about 30 nm thick and about 750 nm long had a resistance of less than about 25 kΩ and did not exhibit the desired conductance oscillations as a function of an applied voltage to the conductance-control electrode at any temperature tested.

In principle, the connecting lines to the conductance-control electrode could add additional capacitance to the circuit and reduce the performance of the device. This problem could be reduced by adding a high-resistance series resistor in series with the conductance-control electrode close to the electrode. Preferably, the conductance-control electrode and its connecting circuit are fabricated from a high-resistivity electrically-resistive material. For example, the conductance-control electrode can be fabricated from the same electrically-resistive material as the current-passage strip.

In certain applications, it may be desirable for the current-passage strip to be a narrow conduction region in a semiconductor material such as a GaAs heterostructure or a Si MOSFET. Such narrow conducting regions can be fabricated using electron-beam lithography. Two metallic gates can be employed. A first gate controls the nominal average resistance of the conducting region at a high gate voltage, and a second gate impresses a conductance-control field to, it is believed, alter the charge or charge distribution in the electrically-resistive conducting region to alter the conductance of the device. In principle, additional isolation resistance can be included by adding one or more additional isolation gates between a tunnelling region and the metallic gates. By applying a voltage—positive or negative depending upon how the semiconductor is doped—to reduce the carrier concentration under or near the isolation gates, the total resistance of the device can be further controlled.

In yet another alternative embodiment, a tunnelling barrier having effective tunnelling capacitance, C, could be produced by a grain boundary connecting two essentially identical narrow metallic strips or via a Schottky barrier formed when two materials of differing electron concentrations are placed in direct contact.

Preferred variable-resistance devices of the invention can serve as a sensitive detector of electric charge, since the conduction-control terminal has an essentially capacative input impedance. Thus, preferred devices of the invention can be used as the input stage for a charge-sensitive electrometer. Moreover, fraction of an electronic charge can be detected by using a negative feedback scheme analagous to that employed in conventional SQUID devices.

An external voltage signal can be also be measured with a device of the invention by adding an additional electrode to the device proximate to the current-passage strip and connecting it to the voltage source to be measured.

The variable-conductance device of the invention can serve as a sensitive detector of electric charge, since the conductance-control terminal has essentially a capacitive input impedance. Thus, the device of the invention can be used as an input stage for charge sensitive electrometer.

The variable-conductance device of the invention can function as a field-effect transistor over particular operating ranges. Moreover, the incremental transconductance of the device can be either positive or negative depending on whether the conductance-control voltage at the operating point corresponds to an increasing or decreasing side of a conductance oscillation.

The variable-conductance device of the invention can also be used to advantage as a digital logic element and to store charge for a read/write memory.

BRIEF DESCRIPTION OF THE DRAWINGS

Preferred embodiments of the present invention will be described below with reference to the following drawings.

FIG. 1(a) is a schematic diagram of a lithography pattern for a lower, electrically-resistive-material layer of the preferred device. FIG. 1(b) is a partial schematic diagram of a lithography pattern for an upper, metallization layer of the preferred device on essentially the same scale as the pattern of FIG. 1(a). FIG. 1(c) is a schematic diagram of a lithography pattern for the upper metallization layer of the preferred device on a reduced scale.

FIG. 3(a) is a partial schematic top view of the first preferred variable-conductance device of the invention fabricated in accordance with the lithography patterns of FIGS. 1(a), 1(b), and 1(c). FIG. 3(b) is a partial schematic top view of the second preferred variable-conductance device fabricated in accordance with the lithography patterns of FIGS. 2, 1(b), and 1(c).

FIG. 4 is a partial schematic top view of a third preferred variable-conductance device of the invention having two conductance-control terminals.

FIG. 5 is a cross sectional schematic view of a fourth preferred variable-conductance device in which a current-passage strip passes between a substrate and a conductance-control terminal.

In FIG. 7(a), the conductance is plotted as a function of an applied magnetic field with the temperature of the device at approximately 238° mK and the conductance-control voltage set to approximately zero volts. In FIG. 7(b), the conductance is plotted as a function of the conductance-control voltage applied to the conductance-control terminal with the device at a temperature of approximately 195° mK and in an essentially zero magnetic field. In FIG. 7(c), the conductance is plotted as a function of the conductance-control voltage applied to the conductance-control terminal with the device at a temperature of approximately 197° mK and in a magnetic field of approximately 9.25 Tesla.

PREFERRED EMBODIMENTS OF THE INVENTION

Figure 1A:
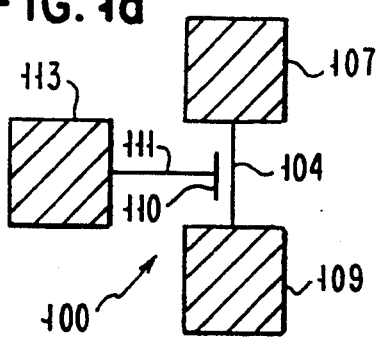
FIGS. 1(a), 1(b), and 1(c) are schematic diagrams of lithography patterns for use in fabricating a first preferred variable-conductance device of the invention.

Turning now to FIG. 3(a), a variable-conductance device 2 has a current-passage strip 4 extending between a current-injection terminal 6 and a current-withdrawal terminal 8. The current-passage strip 4 is composed of crystalline indium oxide. The strip is about 30 nm thick with widths which varied from about 30 nm to about 100 nm for different samples. The length of the current-passage strip 4 measured from an edge of the current-injection terminal 6 and an edge of the current-withdrawal terminal 8 is about 750 nm. Variable-conductance devices with current-passage strips of non-crystallized indium oxide show similar, but somewhat degraded device performance relative to devices with current-passage strips of crystallized indium oxide. A conductance-control electrode 10—also composed of indium oxide—is located about 100 nm from the current-passage strip 4. The resistivity of the indium oxide was controlled by adjusting the oxygen partial pressure during evaporation of the indium oxide. The current-injection terminal 6 and the current-withdrawal terminal 18 are composed of gold and are separated from one another by a distance of about 750 nm. The conductance-control electrode was connected by a gold conductance control terminal 12 located about 750 nm from the current-passage strip 4.

Turning now to FIG. 3b, a variable conductance device 22 includes a current-injection terminal 26 and a current-withdrawal terminal 28. A current-passage strip 24 extends between the current-injection terminal 26 and the current-withdrawal terminal 28. The current-passage strip 24 is divided into two branches 25 and 27 which form an approximately square-shaped loop 29. The current-passage strip 24 including the loop 29 is composed of indium oxide.

The variable-conductance device 22 of FIG. 3b also includes a conductance-control terminal 32 made of gold. A conductance-control electrode 30 is connected to the conductance control terminal 32 and extends proximate to one branch 27 of the current-passage strip 24. The conductance-control electrode is composed of indium oxide.

Turning now to FIG. 4, a third variable-conductance device 42 is similar to the first variable-conductance device 2 of FIG. 3a, with the difference the third variable-conductance device 42 includes a second conductance-control terminal 44 and a second conductance-control electrode 46. The remaining elements of the third variable-conductance device 42 are essentially identical to the corresponding elements of the first variable-conductance device 2 and have been given identical reference numerals. The second conductance-control terminal 44 is made of gold and the second conductance-control electrode 46 is made of indium oxide.

If desired, a modulation signal can be applied to the second conductance-control terminal 44 of the third variable-conductance device 42 and an unknown signal to be measured can be applied to the first conductance-control terminal 12 of the device.

In FIG. 5, a fourth variable-conductance device 62 includes a current-injection terminal 66, a current-withdrawal terminal 68, and a current-passage strip 64 extending between the two terminals 66, 68. The current-injection terminal 66, the current-withdrawal terminal 68 and the current-passage strip 64 are mounted on a substrate 65. A conductance-control electrode 70 is separated from the current-passage strip 64 by an insulating layer 74

Figure 6:
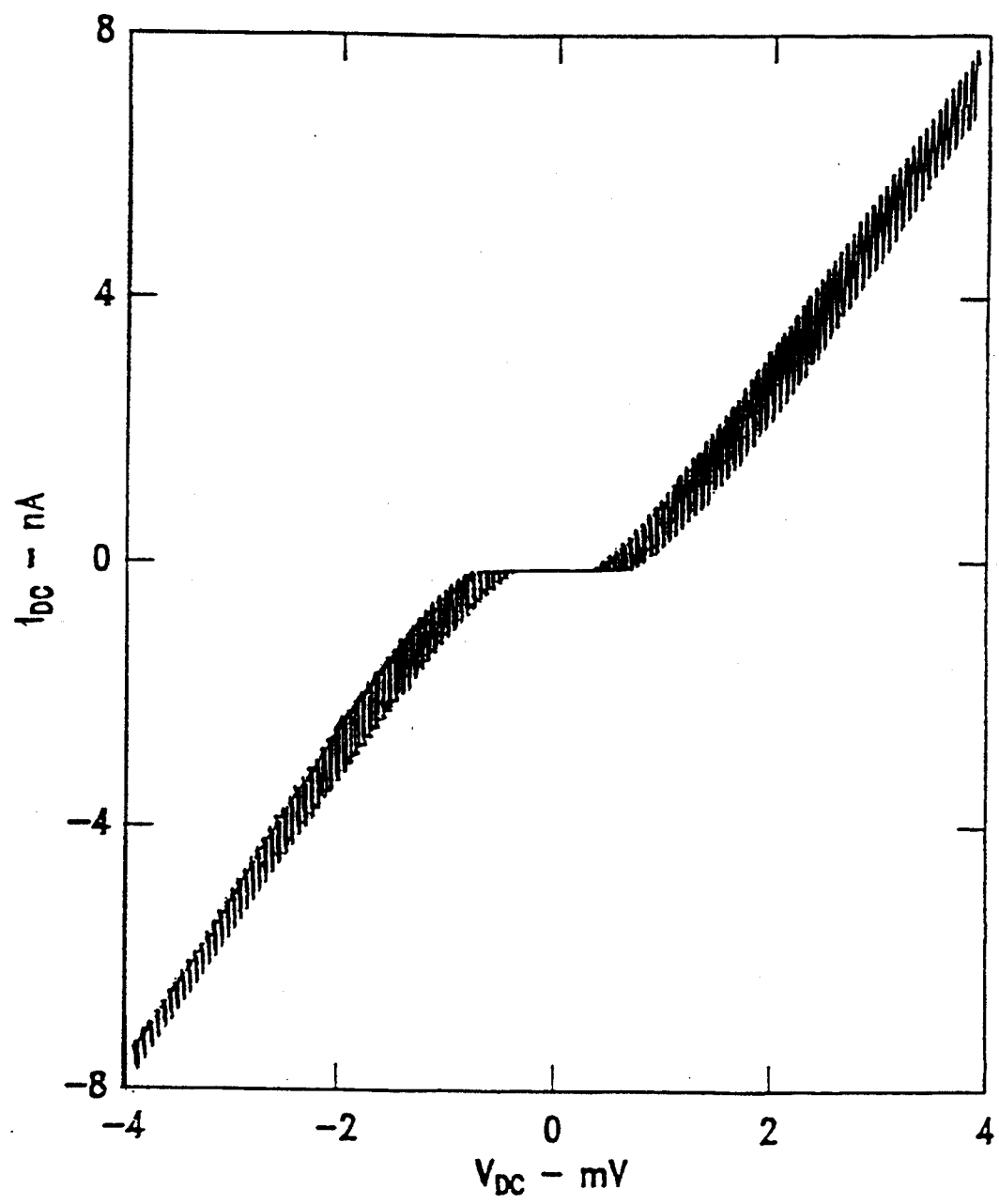
FIG. 6 is a graph of current versus voltage for the second preferred variable-conduction device of FIG. 3b measured between the current-injection and current-withdrawal terminals of the device. The temperature of the device was maintained at approximately 100° mK and an oscillatory conductance-control voltage was applied to the conductance-control terminal as the voltage applied between the current-injection and current-withdrawal terminals was scanned.

FIGS. 6 and 7 illustrate the operation of a preferred variable-conductance device 22 of the type illustrated in FIG. 3b which the current-passage strip 24 includes an approximately square-shaped loop 29. The square-shaped loop 29 was approximately 300 nm on a side. The current-passage strip was composed of crystalline indium oxide about 30 nm thick and about 50 nm wide. The conductance-control electrode 30 was "T" shaped with the element corresponding to the top of the "T" extending approximately parallel to one side of the square-shaped loop 29. The center-to-center distance between the side of the square-shaped loop 29 and the element of the conductance-control electrode was about 120 nm.

For the graph of FIG. 6, the temperature of the device was maintained at approximately 100° mK. The voltage between the current-injection terminal 26 and the current-withdrawal electrode 28 was scanned in an essentially linear fashion from about $-4$ mV to about $+4$ mV over about 10 hours and the current passing out of the current-withdrawal terminal 28 measured. An approximately triangular-wave conductance-control signal having a frequency of about 3 mHz was applied to the conductance-control terminal 32. The conductance control signal varied approximately $\pm 6.5$ mV about zero.

For each of the plots of FIG. 7, the same device as was used for the plot of FIG. 6 was biased with a bias voltage of about $2\mu V$ applied between the current-injection terminal 26 and the current-withdrawal terminal 28. The resulting current passing from the current-withdrawal terminal 28 was measured and divided by the bias voltage to obtain the conductance.

Figure 7A:
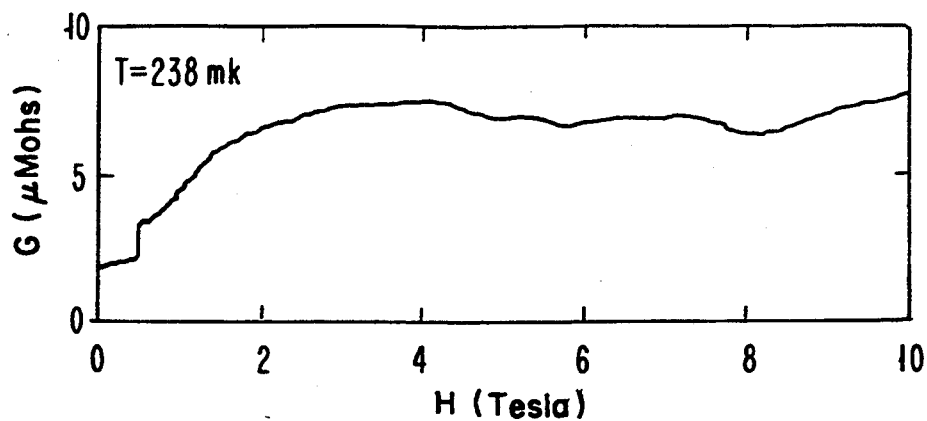
FIGS. 7(a), 7(b) and 7(c) are graphs of the conductance for the second preferred variable-conductance device of FIG. 3(b). The conductance was measured between the current-injection terminal and the current-withdrawal terminal of the device.

For the graph of FIG. 7a, the temperature of the device was maintained at about 238° mK and the conductance-control terminal 32 was grounded. The device was exposed to a magnetic field oriented approximately normally to the square-shaped loop 29. The magnetic field intensity was varied from about zero to about 10 Tesla.

Figure 7B:
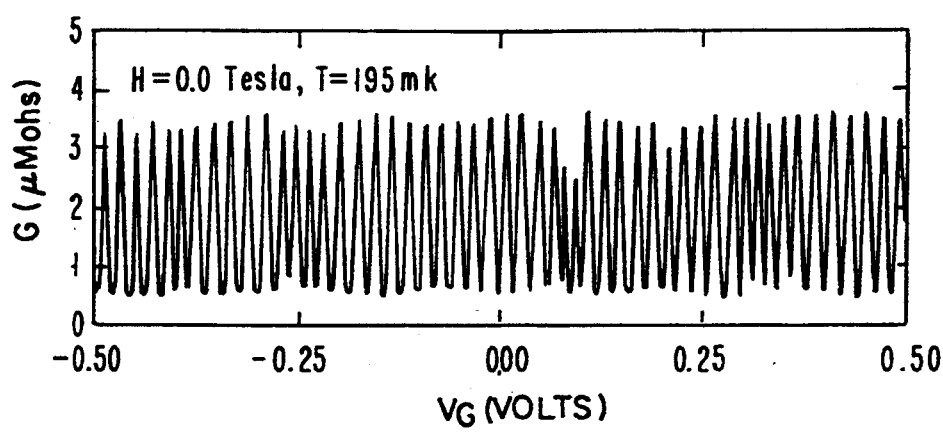

For the graph of FIG. 7b, the temperature of the device was maintained at about 195° mK and the magnetic field intensity set to essentially zero Tesla. A conductance-control voltage was applied to the conductance-control terminal 32 and scanned in an approximately linear fashion from about $-0.5$ to about $+0.5$V. Oscillations in the conductance between roughly 0.5 and roughly 3.5 $\mu$Mhos are clearly evident.

Figure 7C:
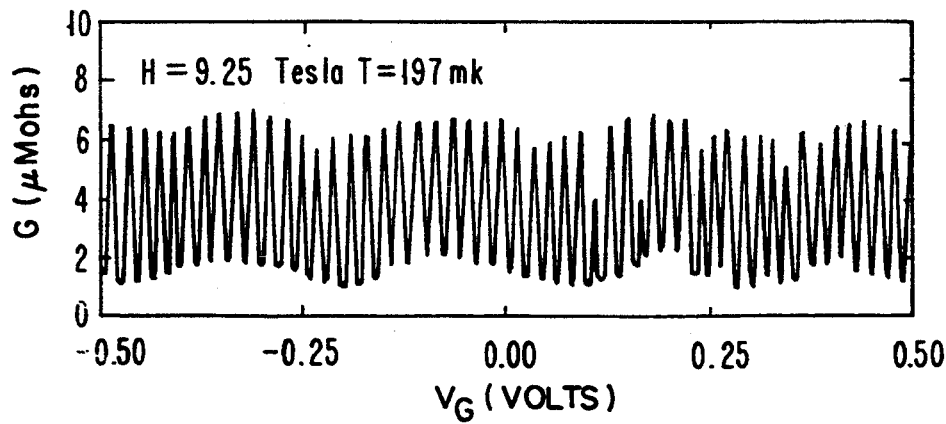

For the graph of FIG. 7c, the experiment of FIG. 7b was essentially repeated with the exception that the magnetic field intensity was set to about 9.25 Tesla. The temperature of the device was maintained at about 197° mK. The conductance of the device oscillated between roughly 1 and roughly 7 $\mu$Mhos as the conductance-control voltage was varied.

Preferred variable-conductance devices of the invention can be made by a two-stage electron-beam-lithography/resist-lift-off procedure set forth below.

A wafer of silicon with a 100 crystallographic orientation is coated with about 500 nm of silicon dioxide by thermal oxidation. An approximately three-percent xylene solution of PMMA resist having a molecular weight of about 360 kilodaltons is prepared. The PMMA resist solution is spun onto the silicon-dioxide-coated silicon wafer at about 1400 rpm to form a resist coating approximately 100 nm thick. The resist-coated wafer is then baked for about two hours at approximately 180° C.

Figure 2:
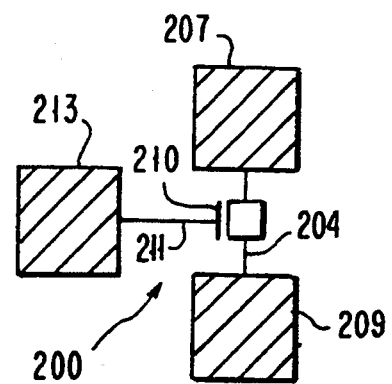
FIG. 2 is a schematic diagram of a lithography pattern for a lower, electrically-resistive-material layer for a second preferred variable-conductance device of the invention.

The resulting resist-coated wafer is placed on an electron-beam writing stage of a scanning electron microscope. The scanning electron microscope has a beam accelerating voltage of about 30 keV and a maximum beam current of about 15.2 pa. An indium-oxide-element pattern 100, 200 as shown in FIG. 1(a) or FIG. 2 is written with the electron beam of the scanning electron microscope using an approximately 30 μm writing field. The lines 104, 110, 111, 204, 205, 210, 211 of the indium-oxide-element pattern 100, 200 are written at approximately a beam dosage of 5.5 picocoulombs/(μm)$^2$. The rectangular areas 107, 109, 113, 207, 209, 213 of the indium-oxide-element pattern 100, 200 are written at a beam dosage of approximately 4.0 picocoulombs/(μm)$^2$. The resist-coated wafer is then removed from the scanning electron microscope and developed in a three-to-one solution of isopropyl alcohol and methylisobutyl ketone for about 30 seconds at about 24° C. The wafer so developed is then rinsed in isopropyl alcohol and blown dry with clean nitrogen gas.

Indium oxide is then evaporated onto the developed wafer using an electron-gun evaporation system. The electron-gun evaporation system has a vacuum chamber in which the wafer is placed. The vacuum chamber is first evacuated to approximately $2 \times 10^{-6}$ Torr. An oxygen pressure of roughly 1 to $2 \times 10^{-4}$ Torr is then establish in the vacuum chamber and maintained during the evaporation of indium oxide. The wafer is not heated. Indium oxide is evaporated with the electron-gun and deposited onto the wafer at a rate of approximately 0.12 nm per second. The total thickness of indium oxide deposited on the substrate wafer may be in the range of from about 18 to about 33 nm, for example, depending on the resistance desired for the indium-oxide-element.

The indium-oxide coated wafer is then removed from the vacuum chamber of the electron-gun evaporation system and placed in acetone. The wafer is left in the acetone until lift off has occurred. The wafer is then rinsed in isopropyl alcohol and blown dry with clean nitrogen. At this stage, the patterned indium-oxide material on the wafer is in an amorphous state. If it is desired to crystallize the indium-oxide material, the following procedure is preferred.

For substantially crystallized indium oxide, two hot plates are heated in air to about 350° C. for approximately one hour to clean the surface of the hot plates. A first of the two hot plates is then set to approximately 250° C. and the second to approximately 400° C. The wafer bearing the amorphous indium-oxide material is placed on the the first hot plate and the temperature setting raised from 250° C. to about 300° C. The wafer is allowed to stand on the hot plate in air for approximately 1.5 hours. The wafer is then transferred to the second hot plate for heating at about 400° C. for roughly 20 to 30 minutes. The second hot plate is then turned off and the wafer is allowed to cool in air while on the hot plate.

A gold metallization layer is formed as follows on the patterned indium-oxide-elements—amorphous or substantially crystalline, as the case may be. The wafer bearing the patterned indium-oxide-elements is spun with an approximately three-percent xylene solution of PMMA resist having a molecular weight of about 150 kilodaltons to form a layer approximately 90 nm thick.

The resist-coated wafer is then baked for about 1 hour at approximately 180° C. An approximately three-percent xylene solution of PPMA resist having a molecular weight of about 360 kilodaltons is spun on top of the previously-applied PMMA resist coating to deposit a second layer of resist approximately 60 nm thick. The double-resist-coated wafer is then baked for about 2 hours at about 180° C.

Figure 1B:
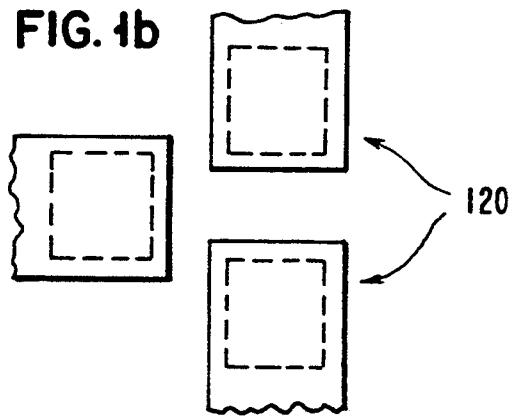
Figure 1C:
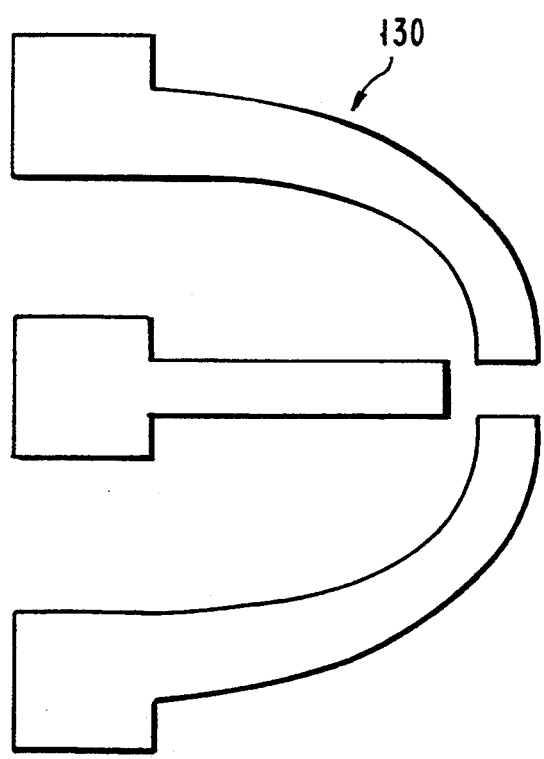

The double-resist-coated wafer is then placed in the scanning electron microscope described above. Using a write field of approximately 30 μm, a metal contact' pattern 120 as shown in FIG. 1(b) is written with an electron beam dosage of approximately 4.0 picocoulombs/(μm)$^2$. A metal connecting-lead/contact-pad pattern 130 as shown in FIG. 1(c) is then written using a large-field writing mode of the scanning electron microscope and the same electron beam dosage used for the metal contact pattern 120. The wafer is then removed and developed as before using three-to-one isopropyl alcohol/methylisobutyl ketone solution. The developed wafer is then rinsed in isopropyl alcohol and dried.

The developed wafer is then placed in a vacuum chamber of the electron-gun evaporation system for evaporating a gold metal layer on the wafer. First, an oxygen plasma is struck in the vacuum chamber using oxygen at a pressure of about $10^{-4}$ Torr. The wafer is exposed to the oxygen plasma for about 3 minutes to clean the surface of the wafer. Gold is then evaporated onto the cleaned wafer at a deposition rate of approximately 0.2 nm/sec in a base pressure of about $4 \times 10^{-6}$ Torr. A total of approximately 25 nanometers of gold may be deposited on the wafer, for example.

The gold-coated wafer is then removed from the vacuum chamber of the evaporation system and placed in acetone until lift off has occurred. The wafer is then rinsed in isopropyl alcohol and blown dry with clean nitrogen. The wafer is diced to individual circuits and test leads are bonded to the metal contact pads.

I claim:

1. A three-terminal, variable-conductance electronic device comprising:
   a. a current-injection terminal for injecting an electric current into the device;
   b. a current-withdrawal terminal for withdrawing current from the device;
   c. a conductance-control terminal for receiving a conductance-control signal to control the electrical conductance between the current injection terminal and the current-withdrawal terminal; said conductance control terminal capacitively couples a discrete charge into an elongated current passage strip connected between said current injection terminal and said current withdrawal terminal;
   d. said elongated current-passage strip composed of an electrically-resistive material, the current passage strip having a longitudinal current-path dimension extending generally along a direction of the current flow through the strip and crosswise dimensions extending generally perpendicular to the direction of current flow through the strip, said elongated strip having a plurality of localized electronic energy states along said longitudinal dimension, said crosswise dimension having a magnitude at least ten times smaller than said longitudinal dimension, electrons in said plurality of localized electronic states tunnel between said plurality of localized electronic states and between said current-passage strip and said current injection terminal and between said current-passage strip and said current withdrawal terminal when said conductance control terminal couples charge to said elongated current passage strip, said electrons in said plurality of localized states do not tunnel between said current-passage strip and said current injection terminal or between said current-passage strip and said current withdrawal terminal when said conductance control terminal does not couple charge to said current passage strip.

2. The variable-conductance device of claim 1 in which the current-passage strip of electrically-resistive material has a resistance of greater than about 25 kΩ.

3. The variable-conductance device of claim 2 in which the current-passage strip of electrically-resistive material has a resistance of greater than about 100 kΩ.

4. The variable-conductance device of claim 1 in which the electrically-resistive material of which the current-passage strip is composed is a semimetal.

5. The variable-conductance device of claim 4 in which the semimetal electrically-resistive material is indium oxide.

6. The variable-conductance device of claim 1 in which the electrically-resistive material of which the current-passage strip is composed is a semiconductor.

7. The variable-conductance device of claim 6 in which the semiconductor electrically-resistive material is gallium arsenide or silicon.

* * * * *